(12) United States Patent
Regnier et al.

(10) Patent No.: US 10,249,983 B2
(45) Date of Patent: *Apr. 2, 2019

(54) CONNECTOR WITH INTEGRATED HEAT SINK

(71) Applicant: Molex, LLC, Lisle, IL (US)

(72) Inventors: Kent E. Regnier, Lombard, IL (US); Jerry A. Long, Elgin, IL (US)

(73) Assignee: Molex, LLC, Lisle, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/967,048

(22) Filed: Apr. 30, 2018

(65) Prior Publication Data

US 2018/0248305 A1    Aug. 30, 2018

Related U.S. Application Data

(63) Continuation of application No. 15/785,065, filed on Oct. 16, 2017, now Pat. No. 9,960,525, which is a continuation of application No. 13/672,142, filed on Nov. 8, 2012, now Pat. No. 9,793,648.

(60) Provisional application No. 61/556,890, filed on Nov. 8, 2011, provisional application No. 61/640,786, filed on May 1, 2012.

(51) Int. Cl.
| | |
|---|---|
| *H01R 13/66* | (2006.01) |
| *H01R 13/533* | (2006.01) |
| *F28F 3/02* | (2006.01) |
| *H05K 7/20* | (2006.01) |
| *G02B 6/42* | (2006.01) |

(52) U.S. Cl.
CPC ............ *H01R 13/533* (2013.01); *F28F 3/02* (2013.01); *G02B 6/4201* (2013.01); *H05K 7/20509* (2013.01)

(58) Field of Classification Search
CPC ..... H01R 13/533; F28F 3/02; H05K 7/20509; G02B 6/4201
USPC ........................................................ 439/533
See application file for complete search history.

(56) References Cited

U.S. PATENT DOCUMENTS

| | | | |
|---|---|---|---|
| 5,982,619 | A | 11/1999 | Giannatto |
| 6,139,367 | A | 10/2000 | Yeh |
| 6,364,707 | B1 | 4/2002 | Wang |
| 6,816,376 | B2 | 11/2004 | Bright et al. |
| 7,052,322 | B2 | 5/2006 | Hu |
| 7,674,136 | B2 | 3/2010 | Steinke et al. |
| 7,764,504 | B2 | 7/2010 | Phillips et al. |
| 8,167,643 | B2 | 5/2012 | Yoshida et al. |
| 8,337,246 | B2 | 12/2012 | Zhang |
| 8,454,382 | B2 | 6/2013 | Zhang et al. |
| 8,469,744 | B2 | 6/2013 | Nichols |

(Continued)

FOREIGN PATENT DOCUMENTS

| | | |
|---|---|---|
| CN | 201360070 Y | 12/2009 |
| TW | M458683 U | 8/2013 |

*Primary Examiner* — Jean F Duverne
(74) *Attorney, Agent, or Firm* — Molex, LLC

(57) ABSTRACT

A receptacle connector defines a port. The port is provided with spring fingers that are configured to engage a mating module. The spring fingers are thermally coupled to a heat transfer plate that can be configured to provide part of a cage that defines the port. Fins can be mounted on or integrated into the heat transfer plate. In operation, thermal energy from an inserted module is transferred from the module to spring fingers and then to the heat transfer plate and then to a thermal dissipation system.

5 Claims, 10 Drawing Sheets

(56) References Cited

U.S. PATENT DOCUMENTS

| | | |
|---|---|---|
| 8,579,660 B2 | 11/2013 | Chow et al. |
| 9,793,648 B2 * | 10/2017 | Regnier ............... H01R 13/533 |
| 9,960,525 B2 * | 5/2018 | Regnier ............... H01R 13/533 |
| 2003/0087559 A1 | 5/2003 | Korsunsky et al. |
| 2003/0139091 A1 | 7/2003 | Kamarauskas et al. |
| 2012/0264330 A1 | 10/2012 | Banakis et al. |
| 2013/0114211 A1 | 5/2013 | Regnier |
| 2013/0189876 A1 | 7/2013 | Lang et al. |

\* cited by examiner

US 10,249,983 B2

CONNECTOR WITH INTEGRATED HEAT SINK

RELATED APPLICATIONS

This application is a continuation of U.S. application Ser. No. 15/785,065, filed Oct. 16, 2017, now U.S. Pat. No. 9,960,525, which is a continuation of U.S. application Ser. No. 13/672,142, filed Nov. 8, 2012, now U.S. Pat. No. 9,793,648, which claims priority to U.S. Provisional Application No. 61/556,890, filed Nov. 8, 2011 and to U.S. Provisional Application No. 61/640,786, filed May 1, 2012, all of which are incorporated herein by reference in their entirety.

BACKGROUND OF THE INVENTION

Field of the Invention

The present invention relates to field of electrical connectors, more specifically to the field of input/output (I/O) connectors.

Description of Related Art

Typical I/O connector systems include a cable assembly and a board mounted connector. The cable assembly, which commonly includes a pair of plug connectors on opposite ends of a cable, is configured to transmit signals over a desired distance. The board mounted connector, which is typically a receptacle positioned in a panel with the receptacle configured to receive and mate with the plug connector.

As data rates have increased, one issue that has been difficult to overcome is the physical limitation of medium that is used to transmit signals from between the plug connectors. Passive cables, for example, are cost effective for shorter distances but tend to be limited with respect to distance as signal frequencies increase. Active copper and fiber optic cables are well suited to transmit signals over longer distances but require power and thus tend to create thermal issues if the connector system is not properly designed. One solution has been to use a riding heat sink on the receptacle but the existing solutions, while somewhat effective, have trouble providing sufficient thermal handling capacity. Thus, certain individuals would appreciate further improvements in thermal management.

BRIEF SUMMARY OF THE INVENTION

A receptacle connector includes a port configured to receive a mating module. The port is provided with spring fingers that are configured to engage the mating module. The spring fingers are in thermal communication with a heat transfer plate that is configured to provide part of the wall that defines the port. Fins can be mounted on the heat transfer plate. In operation, thermal energy from a module is transferred from the module to spring fingers and the thermal energy is in turn transferred from the spring fingers to the heat transfer plate and then to fins (if included). The connector system can be configured so that air flows from front to rear and thus the depicted connector system is suitable for use in an architecture such as a rack system that typically direct air from one side of the rack (e.g., the front or back) to the other side of the rack. If desired, the receptacle can be a stacked connector configuration with two vertically aligned ports.

BRIEF DESCRIPTION OF THE DRAWINGS

The present invention is illustrated by way of example and not limited in the accompanying figures in which like reference numerals indicate similar elements and in which.

DETAILED DESCRIPTION OF THE INVENTION

Figure 1:
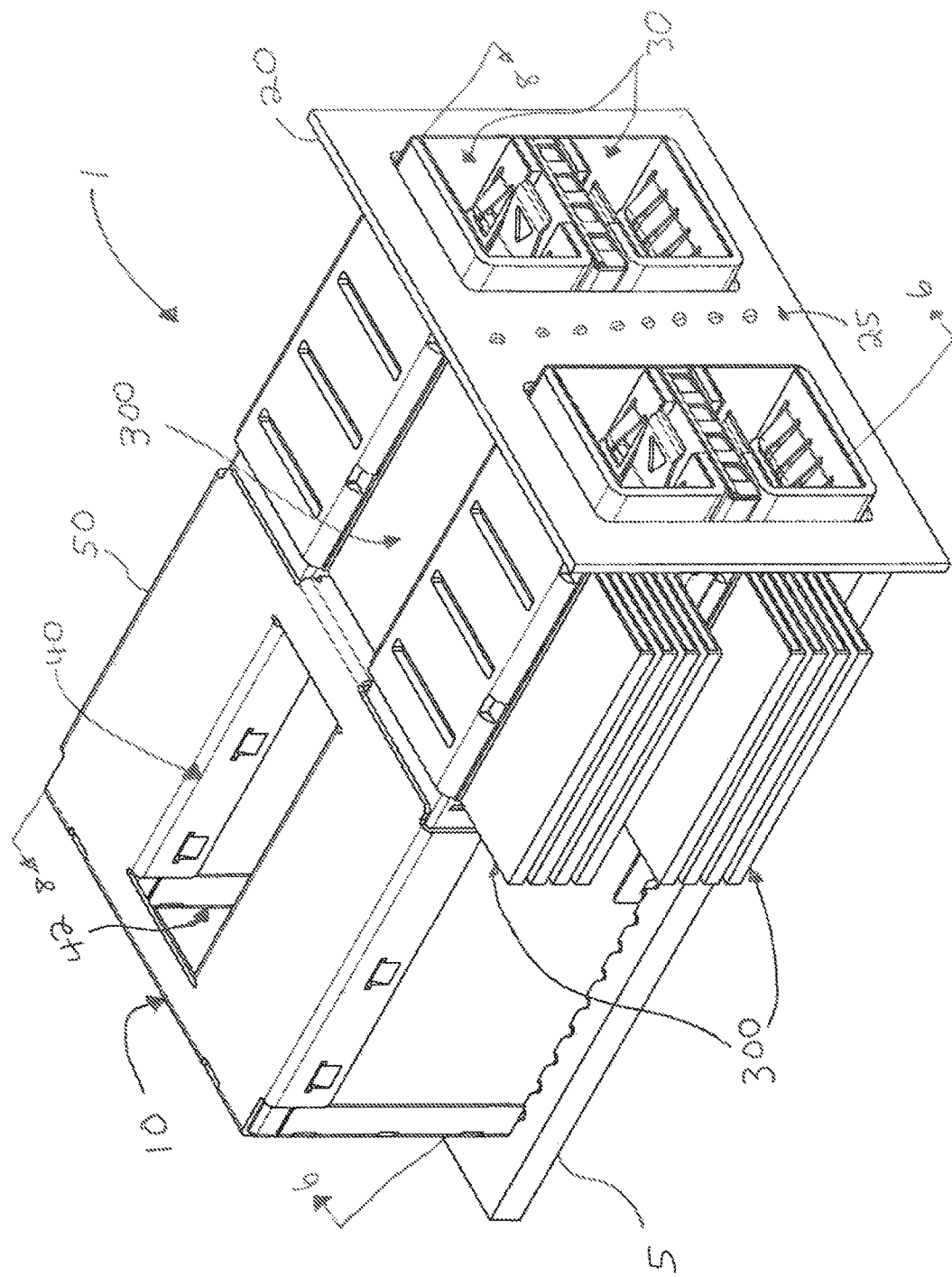
FIG. 1 illustrates a perspective view of an embodiment of a connector assembly.
Figure 2:
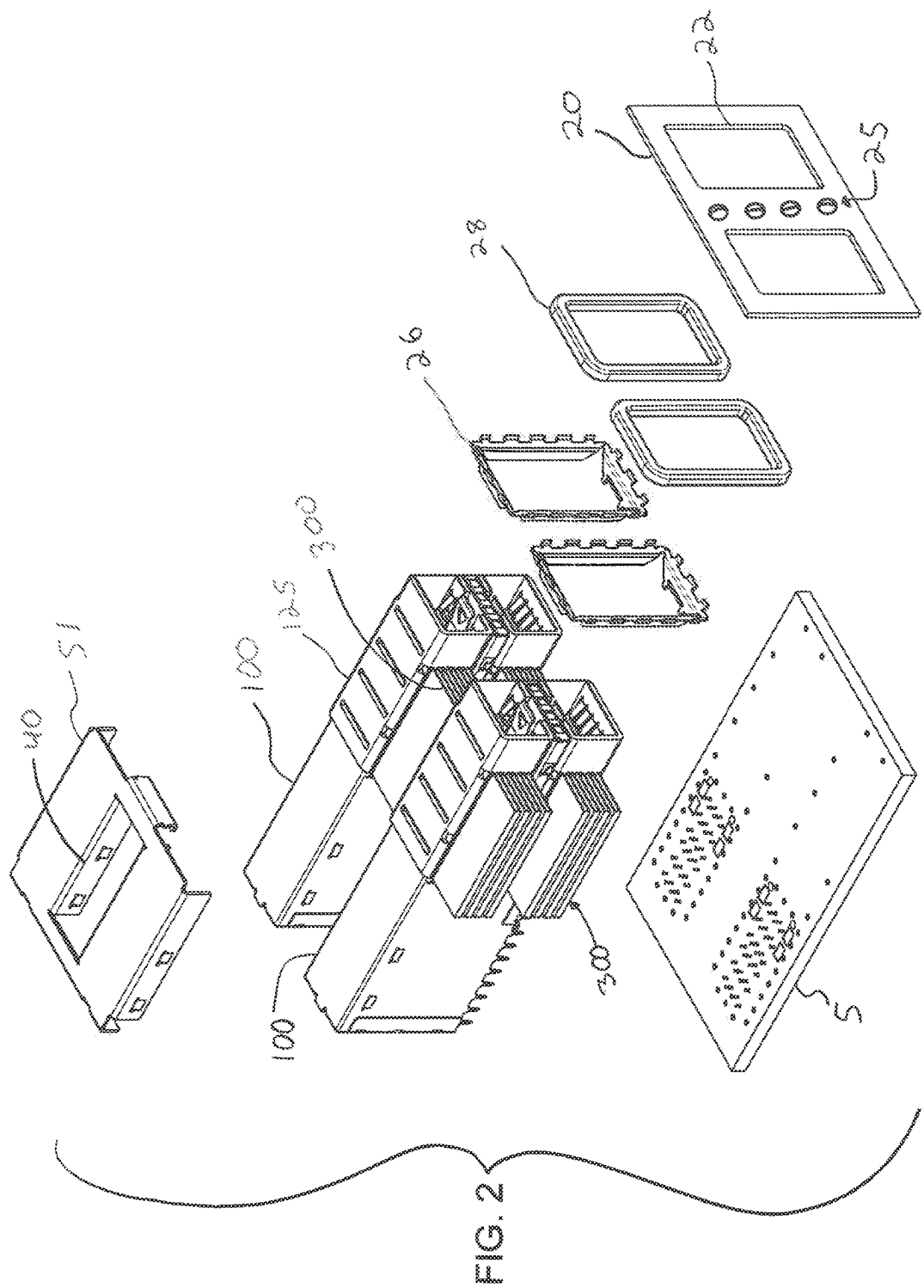
FIG. 2 illustrates an exploded perspective view of the connector assembly depicted in FIG. 1.
Figure 3:
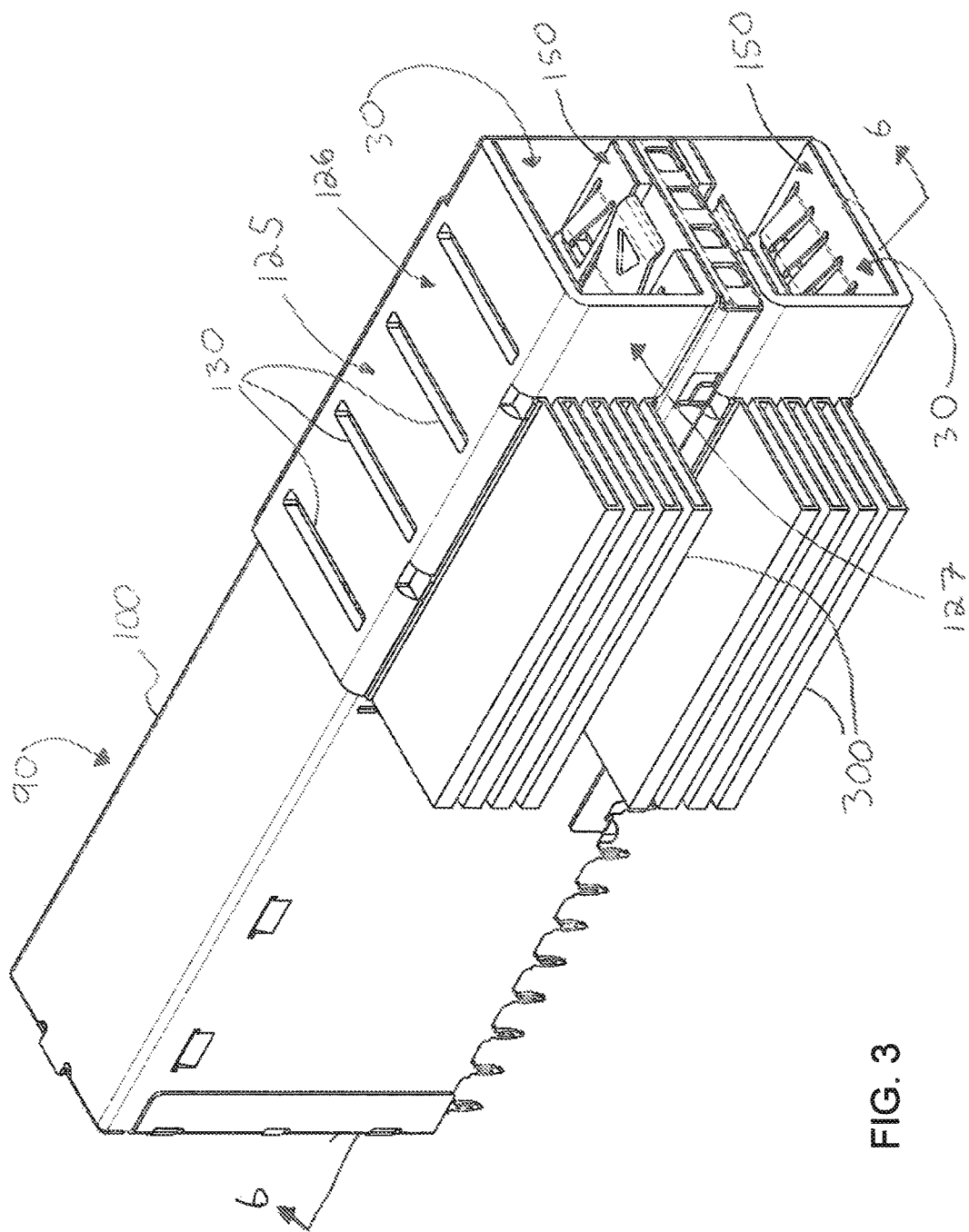
FIG. 3 illustrates a perspective view of an embodiment of a stacked receptacle connector.
Figure 4:
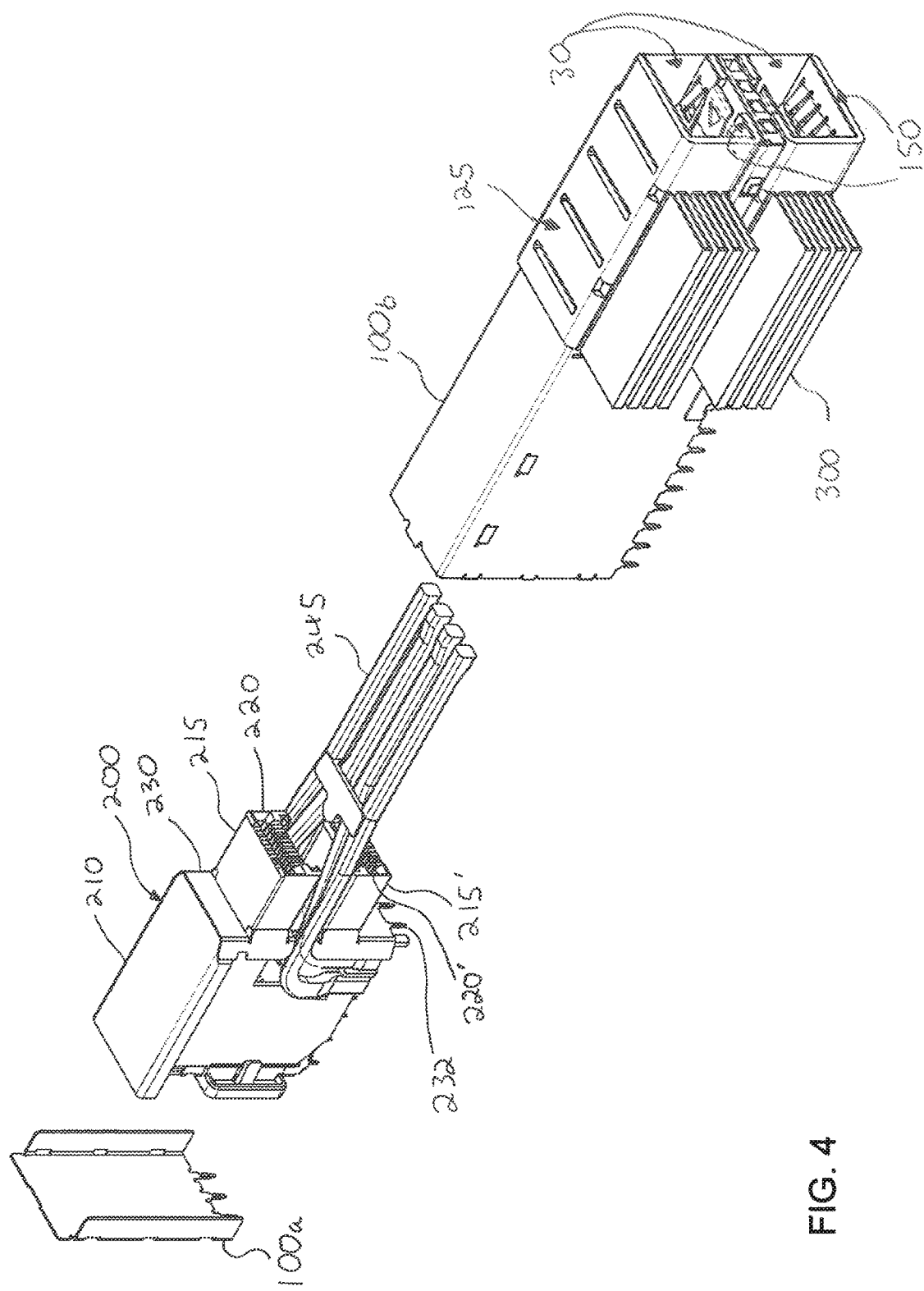
FIG. 4 illustrates a partially exploded perspective view of the stacked receptacle connector depicted in FIG. 3.
Figure 5:
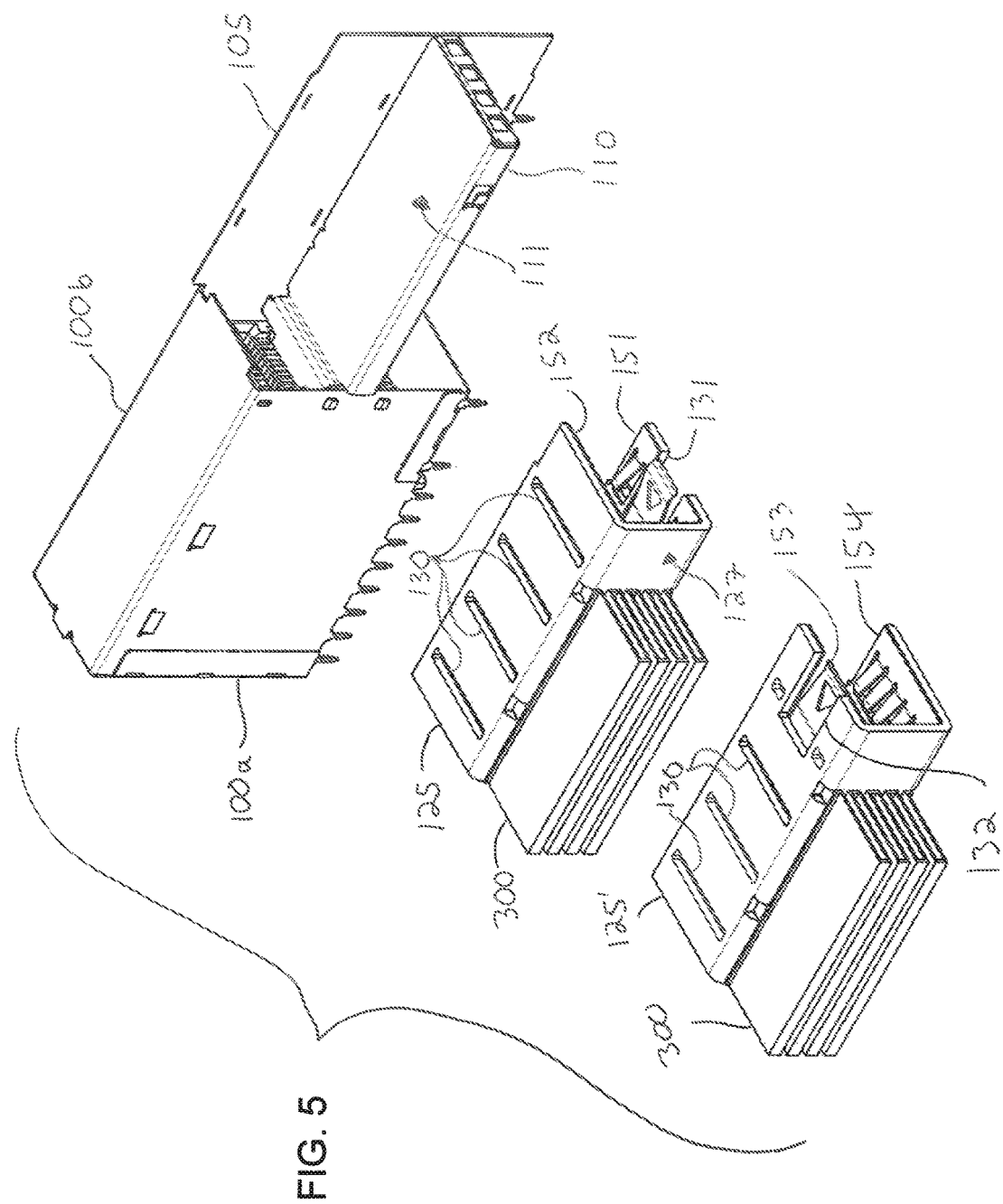
FIG. 5 illustrates another partially exploded perspective view of the stacked receptacle connector depicted in FIG. 3.
Figure 6:
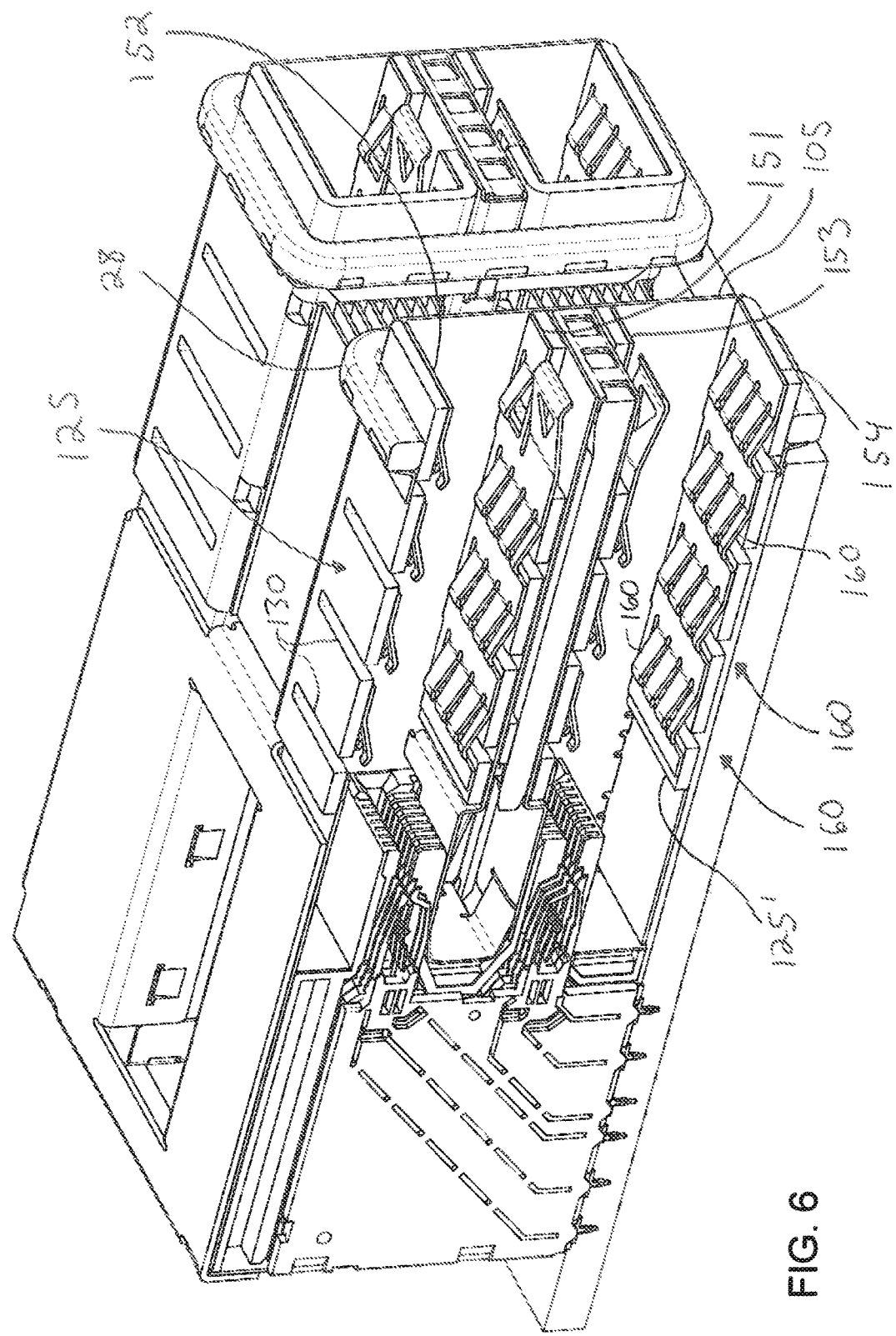
FIG. 6 illustrates a perspective cross-sectional view of an embodiment of a partial receptacle connector system taken along line 6-6 in FIG. 1.
Figure 7:
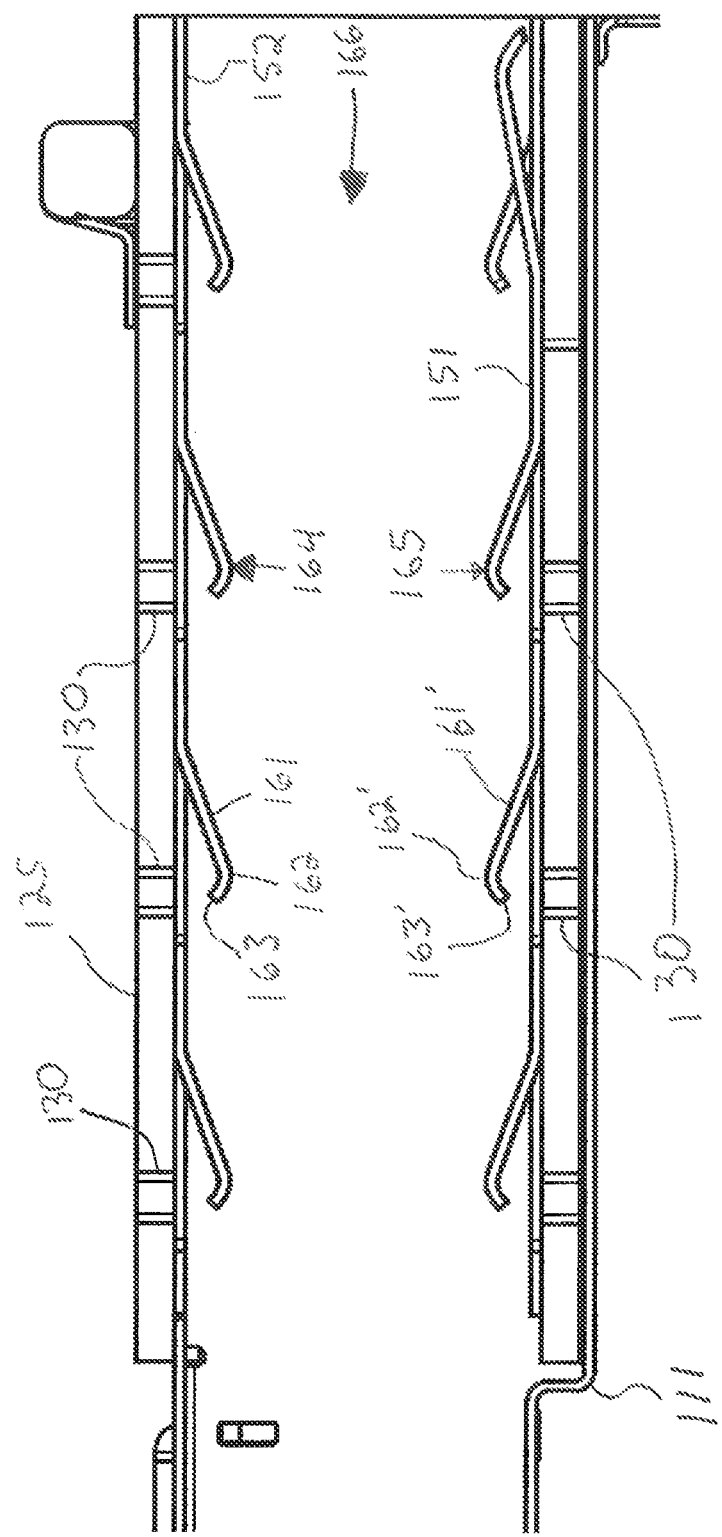
FIG. 7 illustrates a partial elevated side view of a cross-section of an embodiment of a port in a receptacle connector.

The detailed description that follows describes exemplary embodiments and is not intended to be limited to the expressly disclosed combination(s). Therefore, unless otherwise noted, features disclosed herein may be combined together to form additional combinations that were not otherwise shown for purposes of brevity.

As can be appreciated from the figures, a receptacle connector 10 is typically mounted behind a bezel 20 (of which a partial bezel 20 is depicted). If the bezel is considered positioned at a front of the receptacle and the opposite end is considered a rear, then a system architecture may allow for air flow from front to rear. If the system architecture is set up to allow for air flow from front to rear then the bezel 20 can include air intake 25, which can be formed from one or more desirably shaped apertures in the bezel. As can be appreciated, the size of the apertures, as well as the pattern of such apertures, is primarily dictated by the desired air flow needed to cool the system and thus a person of skill in the art will be able to determined the desired air intake 25 configuration based on system requirements.

A connector system 1 includes a connector 10 that is positioned on a circuit board 5 and includes ports 30 position in openings 22 in the bezel 25 and the ports 30 are configured to receive mating plug connectors. As depicted, the design allows for air to be pulled through the bezel 20. An EMI seal 26 and a gasket 28 help the connector 10 seal to the bezel 20.

As depicted, a shield assembly 50 includes a top cover 51 that joins a first and second receptacle assembly 90 together. As depicted, the optional top cover 51 includes an aperture 40 that can be used to direct air flow away from a circuit board 5 while still joining two adjacent receptacle connectors together. As the top cover 51 extends between two cage assemblies 100, the top cover also tends to create a rear passage 42 that can be configured to direct air from the front toward the rear.

As depicted, each receptacle assembly 90 includes the cage assembly 100 that comprises a main portion 100b and a rear portion 100a and further includes heat transfer plates 125, 125' that are mounted to wall 105 of the main portion. Positioned between the heat transfer plates 125, 125' is a center guide 110 that includes a surface 111 that can support the heat transfer plate 125. As can be appreciated, the surface can be stepped to allow sufficient space for the heat transfer plates 125. Of course, it should be noted that the depicted receptacle 90 provides stacked ports 30. A lower profile version of a receptacle connector with a single port would also be suitable and could omit the optional center guide 110 and instead have a single heat transfer plate 125. It should also be noted that while the depicted system includes spring finger plates 151, 152 on what can be considered a top and bottom side of the port 30, other configurations are contemplated. For configurations with lower thermal issues, for example, a single spring finger plate could be used. The spring finger plate and heat transfer plate could also be configured to engage one or two sides of a module (rather than the top and bottom of a module) with a thermal transfer area positioned above or below the module (rather than on the side as illustrated).

Each cage assembly 100 encloses a housing 200 that includes a main portion 210 that supports nose portions 215, 215'. The nose portions 215, 215' each support a slot 220, 200', respectively, that is configured to receive a paddle card from the mating module. A front cage wall 230 includes tails 232 that help define an electrical wall around the main portion 210. As depicted, light pipes 245 may be positioned and configured to extend between and forward of the nose portions 215, 215'.

Figure 9:
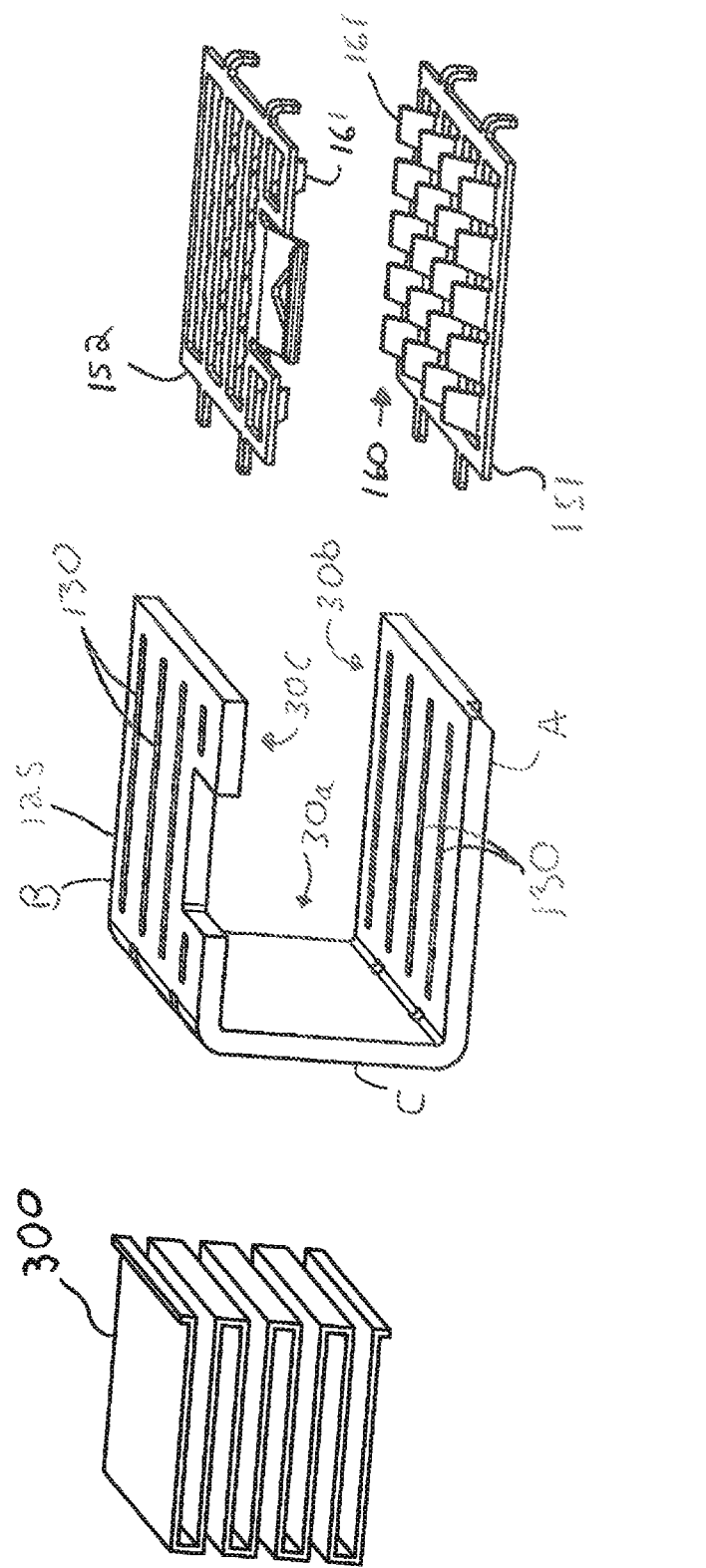
FIG. 9 illustrates a perspective exploded view of an embodiment of a thermal management system.

If desired the heat transfer plate can extend vertically beyond a single port. For example, the heat transfer plate 125 depicted in FIG. 9 could be configured so that a main wall C extends vertically the height of two ports and side walls A, B each engage a single side of a plug inserted into the corresponding port (side wall B engaging the top side and side wall A engaging the bottom side). It should also be noted that if desired, the heat transfer plate need not be one piece but instead could be formed of multiple pieces. As can be appreciated, this allows for a heat transfer plate with a main wall that extends vertically along two stacked ports while still providing for side walls that engage two surfaces of an inserted plug connector. As can be further appreciated, the main wall C will be along a first side 30a of a port (or ports) and side wall A will be along a side 30b of a port and side wall B will be along a side 30c of a port. It should be noted that the sides 30b, 30c can be opposing sides of the same port of two different sides of two different ports. It should further be noted that while the depicted heat transfer plate is depicted as having a U-shaped design, one side could be removed so as to provide a shape more like an L. It is also possible to place the spring fingers directly on the main wall but such a configuration will tend to reduce the amount of thermal energy that can be removed.

In addition, if a more complex heat transfer plate is desired, then the heat transfer plate have the main wall formed of a vapor chamber or some other system that has a lower thermal resistance than a copper plate. For most applications, however, a heat transfer plate formed of a copper plate will be sufficient. It should also be noted that fins 300 need not be positioned on the side between connectors (as shown). Such a system provides certain benefits but if the system is designed to benefit from airflow above the connector then it may be more desirable to have the heat transfer plate direct thermal energy up over the connector and to position fins 300 (or other desirable thermal energy transfer systems such as is possible with liquid cooling and the like) above the connector 10.

As can be appreciated, the depicted configuration beneficially has the ability to allow for a stacked configuration and also takes advantage of the increased surface area that rectangular shaped module (such as an SFP style module) has on the top and bottom surface so as to minimize thermal resistance. In addition, providing spring finger plates on opposing sides helps provide a mechanically balanced system as the opposing spring fingers tend to center the module. It should be noted that the contact force provided by each spring finger 161 can vary depending on the desired thermal resistance (increasing the contact force will tend to improve thermal conductivity) and the desired module insertion force (increasing the contact force will tend to increase the required insertion force). Consequentially, the profile and contact force, which could be, but is not limited to, in a range of about 100 to 400 grams of force per spring finger, can be adjusted so as need to meet the system requirements.

As depicted, the heat transfer plate 125 includes channels 130. The depicted channels 130 extend through the heat transfer plate 125 and provide displacement regions for tails 163, 163' of spring figures 161, 161' when contacts 162' 162' of the spring fingers 161 engage an inserted module. Therefore, when a mating module is inserted in a first direction 166, the spring fingers 161 are translated in a second direction 164 and a third direction 165 and the second direction 154 and the third direction 165 are opposite of each other. As can be appreciated, in alternative embodiments the function provided by the channels could also be provided by depressions or slots in the transfer plate 125 that did not extend through the heat transfer plate. Thus, the displacement region in the heat transfer plate 125 may be a depression or channel that does not extend through the heat transfer plate.

The spring finger plates 151, 152, 153, 154 each include a plurality of spring fingers 161, which each include contact surface 162, 162' and a tail 163, 163'. As depicted, the spring fingers 161 are arranged in rows 160 and each row includes a plurality of spring fingers 161. It should be noted that the depicted pattern of rows makes it straight forward to align the channels 130 in the heat transfer plate 125 with tails 163, 163' so that when a module is inserted into the port 30, the tails 163, 163' can be displaced into the channels 130. The use of rows is not required, however, and other patterns could also be provided as desired.

The spring fingers 161 are configured to engage an inserted module so as to provide a number of thermal contacts to the inserted module. The benefit of such a design as compared to existing designs that tended to use a single plate to engage a module is that the spring fingers 161 can separately engage the surface of the module and thus are better suited to account for variations in surface flatness of the module. While the total surface area (as compared to a large plate typically used with a riding heat sink design) is reduced, it has been determined that the use of multiple springs is actually quite effective and in practice can somewhat surprisingly provide lower thermal resistance between the module and the spring finger plate than is typically provided between a module and a floating heat sink with a planar surface.

The thermal resistance can be managed by increasing the spring force associated with each finger and by varying the number of spring fingers. Generally speaking, the limit on the spring force and the number of spring fingers will be based on the maximum acceptable insertion force and thermal energy that needs to be removed from the module that is to be inserted.

The spring finger plates can be mounted on the heat transfer plates so as to minimize thermal resistance between the two structures. In an embodiment, for example, the spring finger plates can be soldered to the heat transfer plates with a reflow process. In an embodiment, the reflow process could take place in conjunction with the mounting of fins 300 to the heat transfer plate so as to provide an efficient manufacturing process. Of course, other mounting methods could also be used (such as the use of a thermal adhesive or the like). While a solder attach method can provide very low thermal resistance, thermally conductive adhesives (when kept thin) are also suitable because the total surface area is sufficient to provide low thermal resistance between two mating structures. It should be noted that in an embodiment the heat transfer plate and the spring finger plate could be combined into a single structure, however such a structure would be more challenging to manufacture in a high-volume process and therefore the two piece construction is believed to offer lower total costs.

The fins 300 are configured to provide an increased surface area so as to improve heat transfer from the receptacle to the air flowing over the receptacle. As depicted, the fins 300 are configured to provide good heat transfer for air flowing from front to rear (or vice versa). The shape of the fins 300 can be varied, however, so as to be suitable for the desired air flow direction and thus the depicted shape is merely exemplary. It should be noted that the fins are optional and instead of providing fins, the surface of the heat transfer plate could be used. In addition, a system configured for liquid cooling could provide a conduit that rests on the heat transfer plate and is configured to conduct heat away from the heat transfer plate. In addition, if fins were desired the fins could be formed as part of the heat transfer plate. As can be appreciated, however, one advantage of forming the fins separately from the heat transfer plate is that the fins can be designed for a particular air flow configuration and positioned in a desired orientation (e.g., on the side of the connector, above the connector, etc.), thus providing considerable flexibility in the design of the connector.

Figure 8:
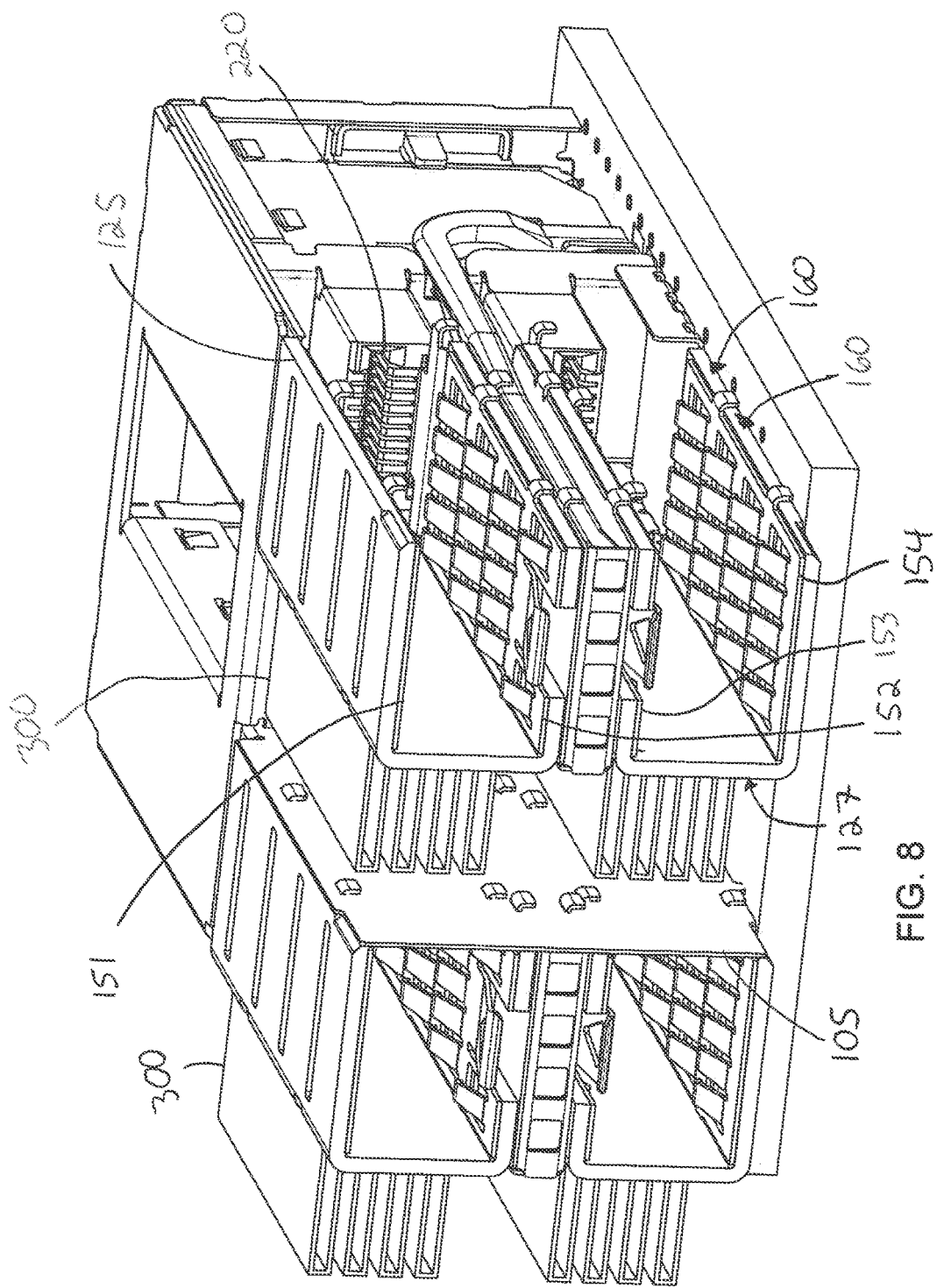
FIG. 8 illustrates a perspective cross-sectional view of a partial receptacle connector system taken along line 8-8 in FIG. 1.

As can be appreciated from FIG. 8, the fins 300 may take up considerable space between two stacked connectors. Therefore, the size and the position may be varied as discussed herein to allow for a reduction in the spacing between ports 30.

In general, therefore, thermal energy from the module is transferred to the spring fingers (and thus to the spring plate). If the spring plate is soldered to the heat transfer plate, the thermal resistance between the spring finger plate and the heat transfer plate can be minimal. Similarly, if the optional fins are soldered to the heat transfer plate, thermal resistance can be minimized. Thus, referring to the thermal energy path illustrated in FIG. 10, it is possible to have a temperature difference between a module and the fins to be less than 15 C and in certain embodiments to be about 10 C. In general, the largest temperature drop (other than temperature drop between the fins and any external air flowing over the fins) will be between the module and the spring finger plate and in an embodiment the temperature difference between the module and the spring finger can be substantially greater than the temperature difference between other components.

While various embodiments are contemplated, it should be noted that the depicted configuration of the thermal pathway between the module and the fins is such that the channels can be aligned with the intended thermal pathway and thus have only a minimal impact on the thermal resistance.

Figure 10:
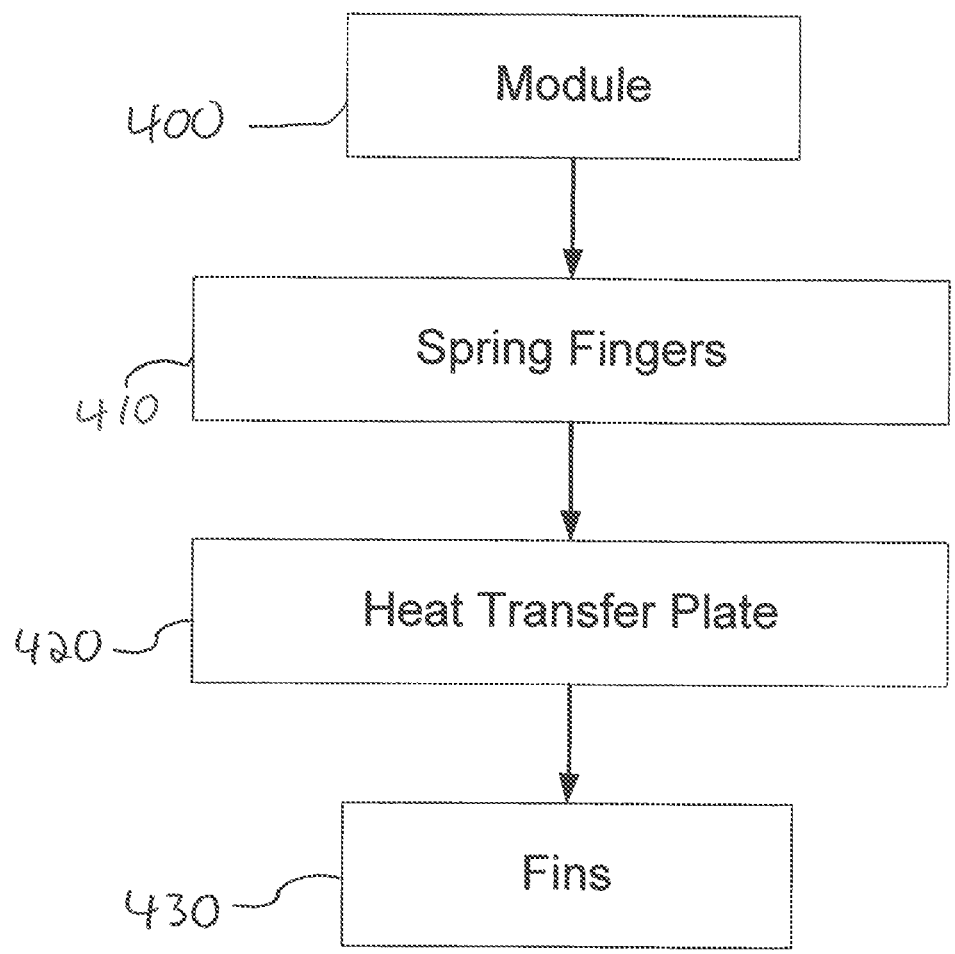
FIG. 10 illustrates a flow chart of thermal transfer from a module.

As can be appreciated from FIG. 10, when a module is inserted into the connector the thermal energy is generated by the module in step 400. This thermal energy is directed away from the module with spring fingers in step 410. Thermal energy is then transferred to the heat transfer plate in step 420. Finally thermal energy is transferred to a system that directs thermal energy away from the system in step 430 (step 430, for example but without limitation, can be performed by the fins 300). It should be noted, however, that in certain systems the fins (or any special thermal transfer system) can be omitted as the improved ability to channel thermal energy away from the module may be sufficient to cool the system. In many applications, however, the increased power output of the module may result in making some sort of thermal transfer system desirable.

Another embodiment of a receptacle connector that includes variations on the features discussed above could be provided. The receptacle connector could include a cage assembly that is configured to enclose a housing. The cage assembly (which can be formed by a number of separate elements combined together) includes a side aperture and a top aperture that allows a thermal system to be used. The thermal system includes a heat transfer plate with a main wall and an upper side wall and a lower side wall. Naturally, some other number of side walls could be added if desired and if desired, just one side wall might be used (although such a system would tend to be most beneficial for a non-stacked configuration).

As can be appreciated, the main wall extends vertically along both ports and thus avoids the need for a thermal transition between the two ports (thus helping to keep thermal resistance low). If desired, and as depicted, the main wall can even extend above top port so as to provide additional surface area As can be appreciated, while the two piece fin and wall design discussed above with respect to FIGS. 1-9 is suitable, the main wall of the thermal transfer plate can be formed via an extrusion so that optional fins are integral with the main wall, thus reducing potential thermal transitions between two elements. The fins act as a thermal dissipation element. Naturally, a liquid cooled solution with a liquid-filled vessel could also be used as a thermal dissipation element to help transfer thermal energy away from the main wall or one of the side walls (thus replacing the fins). It is expected that the use of a liquid-cooled solution would make integration of the heat transfer plate and the thermal dissipation element slightly more complicated (for example, the thermal dissipation element might benefit from being soldered to the heat transfer plate).

The upper side wall can include fins that extend away from the upper side wall in a first direction while the main wall includes fins that extend away from the heat transfer plate in a second direction, the first direction and the section direction being perpendicular. One advantage of this configuration is that an extruded fin design is possible while allow for fins that are well suited to being positioned both on the side and top of the corresponding connector.

The depicted upper side wall can support a spring finger plate that includes a finger that is configured to engage a wall of the cage assembly. The spring finger plate can also support a plurality of spring fingers that can function similarly to the spring fingers discussed above. Notably, the spring fingers extend away from the supporting side wall and are configured to be deflected toward the supporting side wall. One difference is that the spring fingers don't need to include tails that require a recess in the supporting side wall. As can be appreciated, the inclusion or absence of tails will depend on the desired contact interface and the desired amount of lead-in. The spring finger plate can further include a vertical wall and support a retaining leg that extends below the bottom of the corresponding port and can include a retaining member, where both help secure the thermal system to the corresponding cage assembly. It should be noted, however, that the vertical wall, the retaining leg and retaining member are optional and one or the other may be used (or both omitted) depending on the application.

To secure the side walls to the main wall, grooves can be provided to help secure the side walls in place. In an embodiment, the side walls can be soldered in place. As the spring finger plates are also expected to be soldered in place (although such a construction is not required), certain economies of scale can be obtained if everything is soldered together at once.

As can be appreciated, one benefit of the discussed design variations is that the thermal energy from the top of the inserted module can be removed. As thermal energy rises, the top of the module tends to be the hottest and therefore the depicted design keeps the system relatively compact and efficient at directing thermal energy from the module out of the system. One benefit of the design discussed herein is that they are compact and thus helps increase the number of connectors that can be positioned in a particular space. Of course, this additional compactness does decrease the surface area of the option fins which limits its ability to dissipate heat. It is expected that for certain designs it may be more desirable to have the fins on the main wall removed and to replace the fins on the upper side wall with a liquid cooled chamber. The depicted connector system, therefore, is not limited to working with one particular thermal dissipation system.

The disclosure provided herein describes features in terms of preferred and exemplary embodiments thereof. Numerous other embodiments, modifications and variations within the scope and spirit of the claims and the disclosure will occur to persons of ordinary skill in the art.

We claim:

1. A connector, comprising:
 a cage that defines a first port and a second port, the cage configured to be supported by a circuit board, the first and second ports being vertically stacked relative to the supporting circuit board, and the first and second ports each having four walls;
 a plurality of spring finger plates, each spring finger plate forming a wall of each of the first and second ports and supporting a plurality of spring fingers, the plurality of spring fingers configured to engage a module inserted into one of the first and second ports in a first direction, the spring fingers configured to translate in a second direction, in operation, when the module is inserted into one of the first and second ports, wherein each spring finger of the plurality of spring fingers is configured to individually contact the module inserted into one of the first and second ports; and
 at least one heat transfer plate in thermal communication with a spring finger plate of the plurality of spring finger plates.

2. The connector of claim 1, wherein the spring finger plate in thermal communication with the at least one heat transfer plate is soldered to the at least one heat transfer plate.

3. The connector of claim 1, wherein the spring finger plate in thermal communication with the at least one heat transfer plate is attached to the at least one heat transfer plate with a thermally conductive adhesive.

4. The connector of claim 1, wherein each of the spring finger plates forming a wall of the first port are in thermal communication with spring finger plates forming adjacent walls of the first port.

5. The connector of claim 1, wherein the plurality of spring finger plates comprise four spring finger plates forming the four walls of the first port and four spring finger plates forming the four walls of the second port.

* * * * *